United States Patent

Van Saun

[15] 3,703,002

[45] Nov. 14, 1972

[54] ANALOG TO DIGITAL CONVERTER AND INDICATOR USING RECIRCULATION OF REMAINDER

[72] Inventor: Richard W. Van Saun, Edmonds, Wash.

[73] Assignee: John Fluke Mfg. Co., Inc.

[22] Filed: Dec. 6, 1971

[21] Appl. No.: 205,425

Related U.S. Application Data

[63] Continuation of Ser. No. 841,414, July 14, 1969, abandoned.

[52] U.S. Cl. ..........................340/347 AD, 324/99 D

[51] Int. Cl. ..........................................H03k 13/06

[58] Field of Search ..........340/237 AD; 324/99 D; 235/154

[56] References Cited

UNITED STATES PATENTS

| | | | |
|---|---|---|---|
| 2,832,827 | 4/1958 | Metzger | 340/347 X |
| 3,170,153 | 2/1965 | Brooks | 340/347 |
| 3,460,131 | 8/1969 | Gorbatenko | 340/347 |

*Primary Examiner*—Maynard R. Wilbur
*Assistant Examiner*—Charles D. Miller
*Attorney*—Orland M. Christensen

[57] ABSTRACT

A multi-digit analog to digital converter with digitizing means in the output of a differential amplifier to derive the digit value and also feedback applied to the amplifier input in nullifying balancing relation to an analog input signal, such feedback including a component proportional to the derived digit value of the analog input and a component proportional to the resultant arithmetic remainder of such digit value, said digitizing means further storing a recirculatable remainder in analog form proportional to said remainder component multiplied by the digit base, said remainder being substituted for the input analog signal at the end of each digitizing time period in order to operate the digitizing means similarly in the next succeeding digit-deriving cycle, such process being repeated until the analog signal conversion has been carried out to a predetermined number of digit places. The digitizing means comprises a digit base ratio divider connected in feedback relation to the amplifier input, including a counter-controlled ladder network and a feedback resistance, with said ladder network being digitally switched in response to the count of a signal controlled variable frequency oscillator operated, in turn, proportionally to amplifier output exceeding a reference, voltage proportional to the digit base, and with the recirculatable remainder analog feedback being derived in either of two condensers alternately during succeeding digitizing time periods proportionally to amplifier output limited at an upper value proportional to the digit base. Additional feedback means responsive to amplifier output exceeding a value proportional to the digit base supresses amplifier output during digitizing periods. Depending upon input and feedback connections the amplifier may be operated in a straight mode or in an operational mode for positive or negative polarity input signals and avoid common mode rejection errors. Virtual grounding of both differential input sides of the amplifier cyclically enables correction of differential gain drift errors.

17 Claims, 3 Drawing Figures

INVENTOR:
RICHARD W. VAN SAUN
BY
Christensen, Sanborn & Matthews
ATTORNEYS

INVENTOR:
RICHARD W. VAN SAUN
BY Christensen, Sanborn & Matthews
ATTORNEYS

INVENTOR:
RICHARD W. VAN SAUN
BY
Christensen, Sanborn & Matthews
ATTORNEYS

ANALOG TO DIGITAL CONVERTER AND INDICATOR USING RECIRCULATION OF REMAINDER

This is a continuation of application Ser. No. 841,414, filed July 14, 1969 now abandoned.

DESCRIPTION

This invention relates to improvements in the art of converting analog electrical signals into digital values or indications and one object hereof is to provide an efficiently reliable digital voltmeter instrument affording digital accuracy to four or more decimal (or other code) places with a minimum of apparatus requirement. The invention is herein illustratively described by references to its presently preferred decimal code embodiment; however, it will be recognized that certain modifications and changes thereof may be made and that application of the same principles to binary or other code digital conversions are also considered to be within the novel concepts involved.

A further object of this invention is to provide analog to digital conversion decimal code apparatus requiring only one decade counter, one decade of digital to analog ladder network and one decoder for digit indicator activation.

Such multiple usage of common components not only improves apparatus accuracy and simplifies calibration and maintenance checks but enables use of highest quality, highest precision components without unduly inflating cost and increasing bulk of the equipment.

A related object is to provide analog to digital convertor apparatus wherein the input analog voltage need only be available for a brief initial fraction of the total digitizing cycle, namely during a period while digitizing the first digit of the analog number value.

A further object is to provide a means to hold a given digital reading by analog storage means after the input signal is removed or changes value.

Another object hereof is to devise such a converter providing rapid and continuously repeatable digitizing operation through the series of digit places of the number value and providing the digits in sequential order, with the most significant digit first. For multiplexing and similar applications serial digitizing of this type has distinct advantages.

A further object hereof is to provide apparatus of the described nature which lends itself to automatic periodic zero calibration or draft correction in the input amplifier and to adaptations including input amplifier arrangements eliminating common mode rejection errors. The invention further provides a novel means of display utilizing conventional apparatus in a unique manner, a fast and continuous readout type of display, a final remainder (i.e., beyond the last digit place indicated) which itself can be displayed or measured in analog form, if desired, and which permits indicating to a number of significant digit places limited only by noise and accuracy of the divider network.

As illustrated herein, in deriving each digit of the number expressing an analog signal to be indicated, the analog remainder is stored and substituted as the converter input for the next succeeding digitizing operation. The successive digits are indicated by gating or strobing successive indicator digit columns of a Nixie tube indicator or the like in timed relationship with the successive digitizing periods making up a complete conversion cycle carried out to the desired number of digit places. As shown, digit place values in each digitizing cycle are derived from a decade counter which functions to switch the sections of a ladder divider network as a step function voltage source. The total conversion cycle, with digitizing carried out to the required number of places, is repeated at such a frequency that the effect is one of a continuous steady indication of the numerical value of the analog input. Further, pulsing of the decade counter which controls switching of the ladder divider network sections occurs through a voltage or current controlled oscillator responsive to amplifier output exceeding the digit base value in a negative feedback loop so as to accelerate each digitizing phase or period, significant particularly for the larger digits, without overstepping the value at the end of the period.

As a further feature automatic drift correction intercycled with successive digital conversions of an input analog signal may be operated from the same control logic in lieu of or in addition to an added digitizing cycle.

As still another feature, the system may be adapted to store analog values corresponding to the successive digit place numbers representing the analog input, and these analog values then suitably registered or displayed, for an indefinite period if desired, by repeatedly running them through the system in successive order and restoring the original values of each in so doing.

These and other features, objects and advantages of the invention will become more fully evident from the following description with reference to the accompanying drawings.

Figure 1:
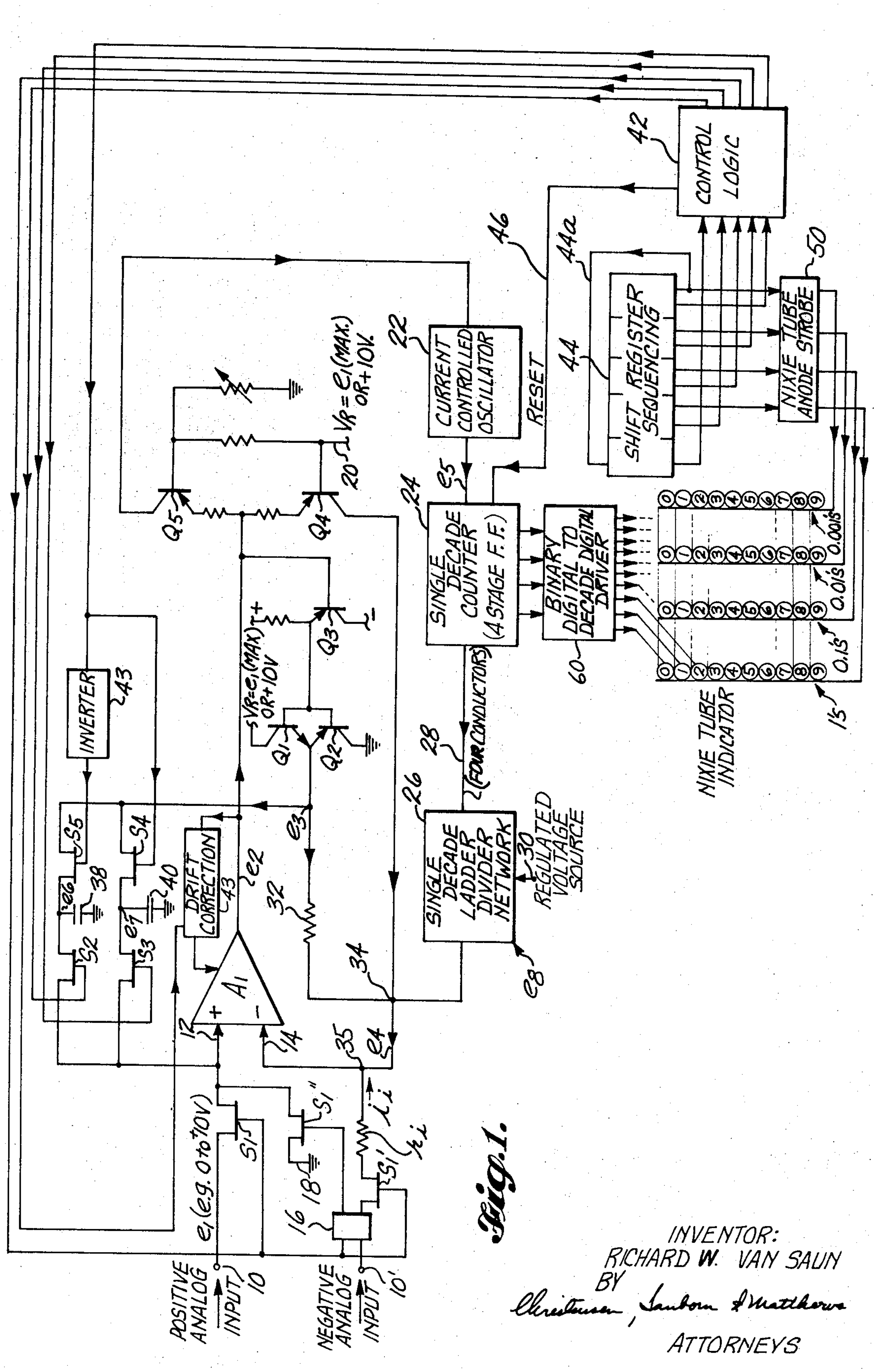
FIG. 1 is a schematic diagram showing the invention in its presently preferred form applied to analog to decimal digital conversion and display.

Referring to FIG. 1, analog input voltage of positive polarity applied at input terminal 10 is conducted to the positive input terminal 12 of amplifier $A_1$ through an initially "closed" switching device, in this case comprising a field effect transistor (FET) $S_1$ normally biased to the on state. The amplifier negative input terminal 14 is in a negative feedback loop to be described and serves only in such capacity when the converter system is operated with an input analog signal of positive polarity. However with an input signal of negative polarity applied to input terminal 10', the amplifier positive input terminal 12 is grounded through FET switch $S_1''$ and the negative analog input signal is applied to the negative terminal 14 by way of FET switch $S_1'$. A negative polarity sensor 16 in the negative input path from terminal 10' opens the path through FET switch $S_1'$ in the absence of a negative input signal and simultaneously interrupts the conductor 18 through opening of FET switch $S_1''$, so that for positive analog input signals (i.e., during the absence of negative input signals) only the amplifier positive input terminal 12 receives input. When the input signals are negative in polarity the input from terminal 10' is applied to the amplifier negative input terminal 14 and the positive input terminal 12 of such amplifier is grounded through FET switch $S_1''$ now biased closed. In either mode amplifier $A_1$ operates with the same relative input polarity.

It will be noted that in the negative polarity input signal mode of operation of the system, with terminal 12 grounded, through FET switch $S_1''$ amplifier $A_1$ performs as an operational amplifier, feedback in which seeks to maintain a balanced input. This is understood by noting that junction 35 is a current summing junction at which, with the amplifier in balance, the input current $i_i$ through resistor $r_i$ is made equal to the feedback currents flowing through divider resistance 32, single decade ladder divider network 26 and transistor $Q_4$. The resistance value of resistor $r_i$ is selected in relation to the resistance value of resistor 32 and network 26 so as to achieve this balance. These elements and their functions are described more fully hereinafter. Thus it will be seen as the description proceeds the first digit of the analog input is determined with amplifier input terminal 12 at ground and terminal 14 maintained at virtual ground. As a result any tendency for error due to common mode rejection of $A_1$ as a differential amplifier is avoided during the first digitizing period. By this it is meant that the amplifier, as a differential amplifier, will respond the same to input signals near zero value as it does to signals near or at the upper input range limit, and thus avoid error effect of an apparent difference of input signal values at the two amplifier input terminals caused only by a change of signal value. This same technique to eliminate common mode rejection error may be extended to apply during succeeding digitizing periods if desired, but more complex circuit arrangements would be necessary.

Assuming an input voltage range of $V_R$, which in the example is 10 volts, amplifier output voltage $e_2$, applied to the emitters of respective transistors $Q_4$ and $Q_5$, is compared against a reference voltage value of $V_R$ (10 volts) applied to transistor base conductor 20. If $e_2$ exceeds this reference value current flows in the collector of transistor $Q_4$ providing immediate negative feedback to amplifier input terminal 14 with a polarity opposing increase of $e_2$ and it thus prevents saturation of the amplifier initially. Simultaneously therewith, collector current in transistor $Q_5$ also flows, activating the current-controlled oscillator 22 for delivering impulses $e_5$ to the single decade counter 24 at a recurrence rate which is rapid at first and diminishes as amplifier output $e_2$ drops progressively to the reference level $V_R$. Impulsing of decade counter 24 steps it through successive stages and in so doing causes the counter stages to perform as stepping switches activating successive corresponding sections of single decade ladder divider network 26. The network 26 functions as a variable voltage source of constant resistance. With each shift or stage change in decade counter 24, the voltage from the divider network increases incrementally by a digital amount, in this case by 1 volt. Thus, the initial contribution of transistor $Q_4$ to total negative feedback voltage $e_4$ is progressively reduced, and eventually replaced, by the stepwise increase of output voltage from divider network 26 as long as amplifier output $e_2$ continues to exceed reference value $V_R$. When the final incremental increase of voltage from network 26 causes $e_2$ to drop below $V_R$,$e_4$ temporarily will overbalance the input signal $e_1$, but another segment of the feedback circuit including resistor 32, to be described later, comes into play at this point so as to restore precise balance between $e_4$ and $e_1$.

Single decade ladder divider network 26 is or may be a conventional ladder type circuit. Each section of the divider network 26 is connected by way of one of the conductors in cable 28 to one stage of the single decade counter 24 such that the sections of the divider network are switched into action cumulatively as the decade counter is stepped through its register by successive impulses from current controlled oscillator 22. Due to the latter's response function, the last impulse of a series from the oscillator 22 is delayed by the longest amount from its predecessor so as to avoid any likelihood of overstepping the proper setting of counter 24, whereas the first impulses of the series from oscillator 22 occur in rapid sequence so as to expedite the digitizing operation performed by the counter. Divider network 26, essentially a special form of potentiometric device, is supplied with regulated source voltage at terminal 30.

Divider network 26 is effectively in series with a divider resistor 32 which has a value equal to $n$-1/$n$ times the sum of the resistance 32 and the constant output resistance value of network 26, wherein $n$ is the digit base (in this case 10). Therefore, network 26 has a resistance value equal to one-ninth that of divider resistor 32. Resistance 32 and network 26 function as a voltage divider having an output junction 34 connected to the negative feedback input terminal 14 of amplifier $A_1$. In effect junction 34 is a summing junction for negative feedback voltage components from three sources: (1) the circuit comprising transistors $Q_3$, $Q_2$, and $Q_1$, behind resistor 32, (2) the step-function voltage source comprising network 26 and (3) saturation control transistor $Q_4$. At the end of each of the successive digitizing operations performed in an A to D cycle, junction 34 carries a feedback of the successive signal $e_4$ (equal to $e_1$) made up of a digit component (e.g., the cumulation of one volt increments in network 26) and a remainder component. This remainder component is one-tenth the value of voltage $e_3$ applied to divider resistor 32. Voltage $e_3$ is prevented from exceeding $V_R$ (e.g., 10 volts) by the clamping action of transistor $Q_1$ having its collector biased at $V_R$ and its emitter connected to the emitter of amplifier transistor $Q_2$ in a cascade circuit wherein transistor $Q_3$ functions as a driver. The base of $Q_3$ is connected to receive the amplifier output ($e_2$).

It will now be evident that if the initial value of $e_2$ does not rise to 10 volts because the input signal $e_1$ is itself less than 1 volt in the illustrative case, then transistors $Q_4$ and $Q_5$ will not conduct at all, this being the condition wherein the first significant digit of the numerical value of the applied analog input is zero. Thus, the contribution of feedback voltage at junction 34 from divider network 26, also from transistor $Q_4$, is zero and the total feedback voltage applied to the junction 34 is that of $e_3$ divided by 10 in the divider network 32, 26.

If the first digit value of the analog input signal $e_1$ is the number "one," or larger to a maximum of "nine," the amplifier input will not be balanced out and the negative feedback loop stabilized until after the necessary digitizing operation by elements 22, 24, and 26. Upon reaching stabilization feedback voltage at summing junction 34 now comprises the value in volts ($e_8$) of the numerical digit from network 26 and the value in volts of the analog remainder ($e_3$ divided by 10).

It is an important as a feature of the invention that remainder voltage $e_3$ be equal to the true analog remainder of the digit multiplied by the digit base, in this case by 10, so that $e_3$ may be stored and recirculated through the amplifier as the new or substitute input signal to amplifier $A_1$ in order to perform the next succeeding digitizing operation. For this latter purpose, during the first digitizing period the value of $e_3$ is sampled and held on condenser 38 by conduction through FET switch $S_5$ in the closed or on condition with FET switch $S_2$ off. Then by opening input signal switch $S_1$, opening $S_5$ and closing $S_2$, the stored analog remainder value $e_3$ on condenser 38 is applied as substitute input analog voltage to input terminal 12 of amplifier $A_1$. Amplifier $A_1$ now delivers a new output $e_2$ to start another digitizing operation, wherein the previous remainder is itself digitized. In this process the next or second digit is determined and a new remainder formed. As it is formed it is sampled and held on condenser 40, with FET switch $S_4$ closed and FET switch $S_3$ open. At the end of the second digitizing period $S_4$ is opened and $S_3$ closed so that the new remainder voltage stored on condenser 40 is now applied as the substitute input to terminal 12 of amplifier $A_1$ to commence the third digitizing operation, during which condenser 38 is again available to sample and hold the remainder derived in determining the third digit.

Figure 2:
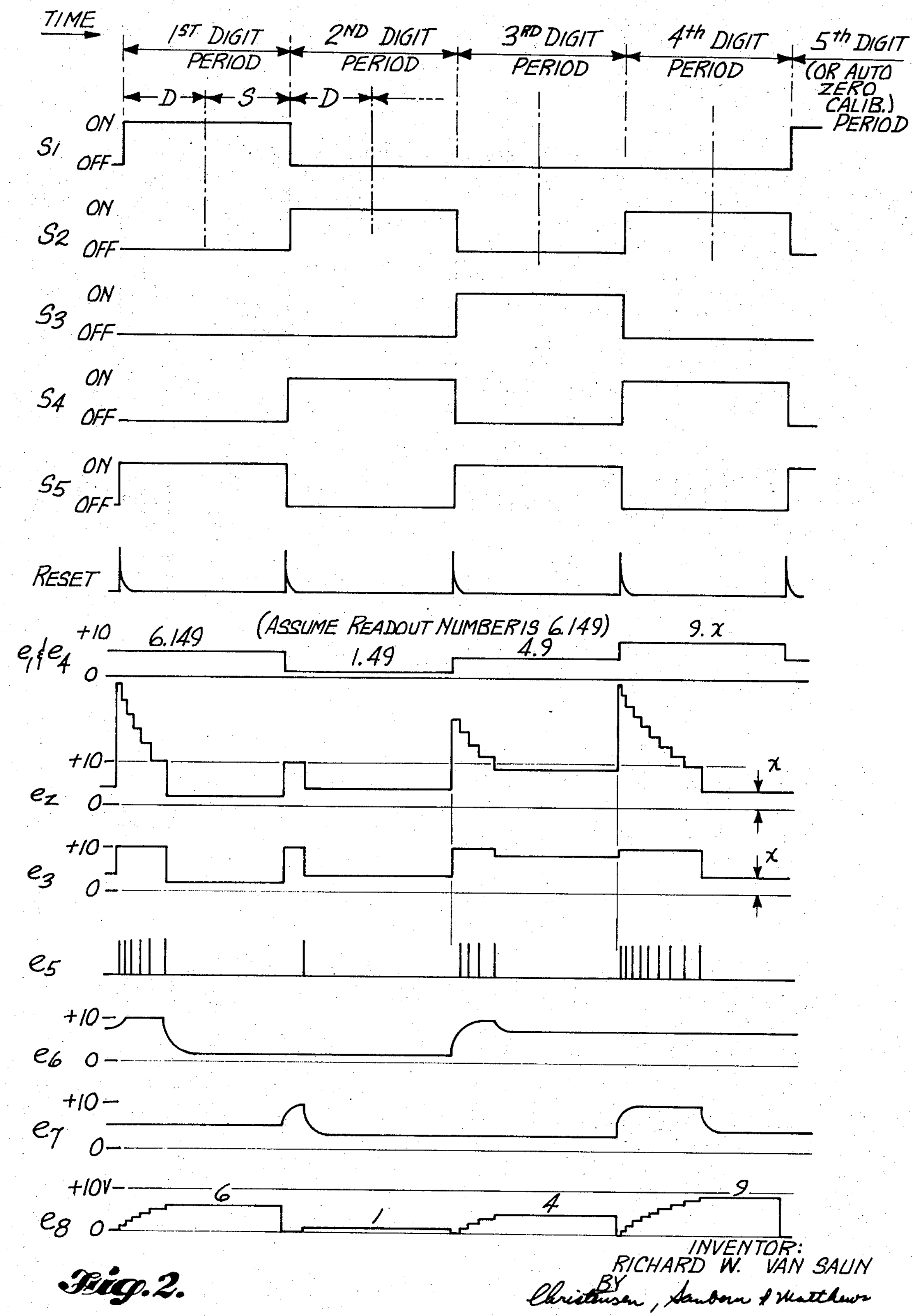
FIG. 2 is a wave diagram as an aid to understanding operation of the system shown in FIG. 1.

Inverter 43 permits FET switches $S_4$ and $S_5$ to be driven by the same gate conductor from control logic 42 with these switches operated precisely out of phase with each other as depicted in FIG. 2.

It will therefore be seen that condensers 38 and 40 are available to function alternately in performing their respective remainder value sample and hold functions and that when the held value on one condenser is being applied as new input to amplifier $A_1$ the other condenser is sampling and holding the value of the new remainder value $e_3$ being developed. FET switches $S_1$, $S_2$, $S_3$, $S_4$ and $S_5$ are operated by the control logic 42 in response to the states of the successive stages of the shift register 44 which serves as an example of a suitable basic switching control device or sequencing clock for the total system. In the example, the shift register has five stages and provides a series of five equally spaced timing pulses or gates to the control logic 42. Typically, it generates this series at a recurrent rate of 40 or more times per second so that the strobed light digit indicator later to be described will provide a steady visible indication. The control logic 42, employing any suitable or conventional logic circuit technique, converts each such series of control gates from register 44 into several control gates and impulses having special phasings and durations as shown best in FIG. 2. One of these is the short reset impulse applied by way of conductor 46 to the single decade counter 24 so as to reset the counter at the end of each of the successive digitizing periods, labeled in FIG. 2 as "1st digit," "2nd digit," etc. Reset occurs coincidentally with the inception of the first gate from register 44 causing control logic 42 to apply a gate, labeled $S_1$ in FIG. 2, which closes FET switch $S_1$ and establishes the first digit period during which input analog signal $e_1$ is applied to amplifier $A_1$. The related switching waves applied to FET switches $S_2$, $S_3$, $S_4$ and $S_5$ are likewise shown in the succeeding underlying diagrams in FIG. 2. The switching waves $S_1$–$S_5$ control FET switches in such a manner as to establish the successive digit periods making up the total conversion cycle, there being four such digit periods in the four-place converter illustrated. A precycling (or fifth) period is also established in the system by employing a fifth stage in the shift register (it is shown as the first stage but it could also be the last or any intermediate stage for that matter) and causing the control logic 42 to generate a gating wave which renders the FET switch $S_1''$ conductive for a period between successive digitizing periods, thereby to ground amplifier input terminal 12 momentarily. At the same time, divider network 26 is also in its zero voltage or effective ground input setting. With both inputs of amplifier $A_1$ thus simultaneously placed at effective ground any amplifier output $e_2$ represents drift or error, and this is sensed in unit 43 and utilized in a suitable or conventional manner to correctively adjust the bias or other control in amplifier $A_1$ preparatory to the next succeeding digit period sequence. This drift correction is done on an intercyclic basis so that the amplifier $A_1$ remains substantially continuously corrected for a drift caused by temperature changes or other conditions affecting its response as a differential input balancing system. An important advantage of calibrating the amplifier with the ladder network 26 included in the grounding path for input terminal 14 is that the resultant calibrational correction applied by drift correction it 43 corrects for drift off sets in zero setting of the ladder network itself as a part of the total amplifier and input system being thus corrected for differential offset drift.

In FIG. 2 the wave diagram designated $e_1$ and $e_4$ is drawn on the assumption of an analog input signal numerical value equal to 6.149. This diagram illustrates that the feedback voltage $e_4$ matches the input voltage to amplifier $A_1$. In the second digit period, with the first significant digit value subtracted, the computed remainder multiplied by 10 is now as a new analog remainder value at the input scale of the original signal $e_1$. This same changing of scales occurs in the succeeding digit periods for the respective remainders derived therefrom and recirculated through the amplifier. The diagram designated $e_2$ illustrates how the amplifier output voltage $e_2$ is adjusted progressively downward by increments in each digit period to a final or holding value less than 10 volts, beyond which no further digitizing takes place and the retained value than represents the remainder of the digit. Thus in the first digit period with a first digit of "6," there are six steps in the reduction of $e_2$, the last step reducing the number $e_2$ to a value corresponding to the value of the remainder, or "6.149" in the example. In the second digit period wherein the remainder is now expressed as the number "1," there is only a single step in reducing $e_2$ to the new remainder value of "0.049." In the third digit period, with the remainder now expressed as "4," there are four steps involved in reducing $e_2$ to the new remainder of "0.9," whereas in the last digit or fourth digit period there are nine steps to reduce the remainder to a value X which itself is not expressed numerically in the readout register but which is carried as an analog value during the last half S of the fourth digit period and may be shown on a cathode ray tube screen or otherwise detected if its value is to be indicated or extracted for any purpose. Due to the limiting action afforded by transistor $Q_1$, referenced to voltage $V_R$, (10 volts) the waveform of voltage $e_3$ takes on the character illustrated in the diagram wherein it assumes the holding value of $e_2$ after digitizing but wherein it remains constant at 10 volts during the digitizing steps of $e_2$.

The diagram $e_5$ illustrates the manner of operation of the voltage controlled oscillator delivering successive pulses to the decade counter 24 at progressively decreasing rates during each series of pulses. The diagram $e_6$ and $e_7$ respectively illustrate the change of voltage on the respective alternately acting condensers 38 and 40 during the sampling and holding periods thereof.

FInally, the diagram $e_8$ illustrates the step voltage generating function of the single decade ladder divider network 26 in response to operation of the single decade counter 24 as the latter is periodically reset and then cycled to the different numeric values to be digitized.

In order to provide a continuous indication in numerical form of the digital conversion performed by the system, the digitizing cycle periods labeled first digit, second digit, etc. in FIG. 2, are divided into first and second parts, D and S respectively. The first period D is used for the digitizing operation and the second period is used for the readout operation. For purposes of readout, banks of Nixie tubes are provided corresponding with the respective digit places to be represented, i.e., the "ones" place, the "tenths" place, the "one-hundredths" place and the "one-thousandths" place in the example. The respective banks of tubes are strobed or activated in successive order during the respective digit periods by anode driver stages in the strobe control 50 responsive to the second-half cyclings of the successive stages of shift register 44. Correspondingly numbered Nixie tubes in the respective banks are connected together and to one of the ten output channels from binary digital-to-decade digital driver stage 60 as shown. Thus the Nixie tube number that is actually displayed in any bank of Nixie tubes is the number held in the driver stage 60 at the instant the anodes of the Nixie tubes in that bank are strobed on by unit 50.

The Nixie tube lights which display the number digits are switched on and off at such a rapid recurrence rate (40 or more cycles per second) that persistance of vision leaves the impression of a steady number value registered in the image plane of the indicator device. Moreover, by having their "on" period (i.e., measured by the duration of the S portion of each digit cycle) as long as feasible, the steady illumination intensity effect is maximized.

In analyzing the operation of the circuit in FIG. 1, it will be noted that the analog input voltage is applied during only the 1st digit period of each successive conversion cycle and that it is removed during the succeeding digit period; consequently fluctuations in analog input voltage which might occur during a total conversion cycle do not affect the readout digits and the system therefore has a sampling or stabilizing effect. As a result of this characteristic of the system it obviously lends itself to use in not only the transmitting ends of multiplexing system but also in the receiving ends thereof wherein analog values to be converted into digital form are available only momentarily and periodically. In such applications a suitable synchronizing signal associated with the multiplex operation would be used to start the shift register 44 cycle.

In operation, assuming a conversion cycle starts at the inception of the automatic zero calibration period, decade ladder network 26 is at its zero voltage or grounded setting and FET switch $S_1''$ is closed. Thus both inputs 14 and 12 of amplifier $A_1$ are simultaneously at effective zero to establish effective zero input to amplifier $A_1$ whereby drift correction 42 approximately readjusts the relative offset of the sides of differential amplifier $A_1$ to calibrationally reduce its output $e_2$ to zero.

Next in sequence, control logic 42 operated by shift register 44 closes FET switches $S_1$, $S_1'$ and $S_1''$ and $S_5$, with the others remaining open, in order to start the 1st digit period. If the analog input is positive, the input signal passe from input terminal 10 to the amplifier positive input terminal 12. If the analog input signal is negative, polarity sensor 16 completes a path through conductor 18 and through the conductor between negative input 10' and FET switch $S_1'$ so that the negative input signal reaches amplifier negative terminal 14 while FET switch $S_1''$ grounds amplifier input positive terminal 12. In either case amplifier input relative polarity is such that output $e_2$ immediately rises. If on the input range scale indicated (10 volts max.) the input signal is less than 1 volt, negative feedback through one-to-ten voltage divider 32, 26 by way of transistor $Q_3$ and $Q_2$ will be sufficient to null the input of $A_1$ at a balance with $e_4$ equal to the input signal value and with $e_3$ 10 times $e_4$. Since decade counter 24 has been reset to zero at the inception of the first digit, and $e_2$ rose to a value less than 10 volts, (i.e., insufficient to overcome the bias $V_R$ on transistors $Q_4$ and $Q_5$) no output pulses emerge from oscillator 22 and decase counter 24 remains at zero. Consequently, upon transition from the digitizing portion D to the strobing portion S of the 1st digit period by the shift register, the first or "1's" bank of Nixie tubes is strobed by driver 50 and a zero is indicated as the first digit value of the analog input.

During the first digit period, FET switch $S_5$ being closed, the attained value of $e_3$ is sampled and held on denser 38 as voltage $e_6$, and representing the remainder of the first digit. Next in sequence, signal input switches $S_1$, $S_1'$ and $S_1''$ are opened and the remainder voltage on condenser 38 applied to the amplifier input positive terminal 12 (regardless of whether the analog input signal has been positive or negative) by way of FET switch $S_2$, now closed. At the same time FET switch $S_5$ is opened and FET switch $S_4$ is closed, with $S_3$ remaining open to initiate the second digit period, wherein any accumulating remainder $e_3$ is now sampled and held on condenser 40.

The immediately foregoing described sequence assumed a first digit place value of zero for the analog input signal, whereas in the chosen example the analog input signal is equal to the illustrative value 6.149 (FIG. 2). In this numerical example, with the inception of the 1st digit period amplifier output voltage $e_2$ would have risen above 10 volts to draw current in the collectors of $Q_4$ and $Q_5$. $Q_4$ immediately delivers negative feedback to prevent saturation of amplifier $A_1$ and $Q_5$ activates current-controlled oscillator 22 so as to pulse the single decade counter 24. With a numerical value of six for the first digit of the analog input signal six pulses from oscillator 22 are delivered to counter 24 and thereby six 1-volt steps accrue in ladder divider network 26 as a step-function voltage source of constant resistance value. With the last of the six steps taken in the output $e_8$ of network 26, the voltage $e_3$, clamped at 10 volts by $Q_1$ in the interim, is now dropped back to a value of $e_3$ representing 10 times the remainder, such that the sum of 6 volts and one-tenth of $e_3$, as manifested at summing junction 34, produces a net feedback $e_4$ which balances out the input $e_1$ so as to balance $A_1$ and stabilize the feedback loop. Of course $Q_4$ drops back in its supply of feedback current during the stepwise increase in output of divider network 26. Likewise $Q_5$ also drops back so as to reduce the rate oscillator 22 pulses counter 24. Then at the transition of digitizing phase D to strobing phase S of the first digit period, the first or "1's" bank of Nixie tubes is strobed and, with counter 24 having been pulsed six times by oscillator 22, the number "6" is indicated at the first digit place.

AT the inception of the second digit period, counter 24 is reset by the control logic and FET switches $S_2$ and $S_4$ are closed. $S_5$ is opened while $S_3$ and $S_1$, $S_1'$, and $S_1''$ remain opened, such that the remainder signal $e_3$ (now $e_6$) stored on condenser 38 is applied to amplifier input terminal 12 at 10 times the original true remainder value (manifested at junction 34) and thereby operates the converter at full scale for digitizing the second decimal place value of the input analog signal. In like manner the sequence repeats for each of the successive digit periods so as to derive precisely the successive digit place values of the input analog signal carried out to the desired number of decimal places. After the last decimal place is filled, depending upon the number of significant places to which the process is carried out, condenser 38 or condenser 40 will carry a final remainder which, if desired, may be indicated in some suitable manner such as by way of a cathode ray oscilloscope, a sampling detector, or otherwise. The number of decimal places to which the digitizing of an input signal may be carried out is not limited except by noise and by the accuracy of single decade ladder divider network 26.

Figure 3:
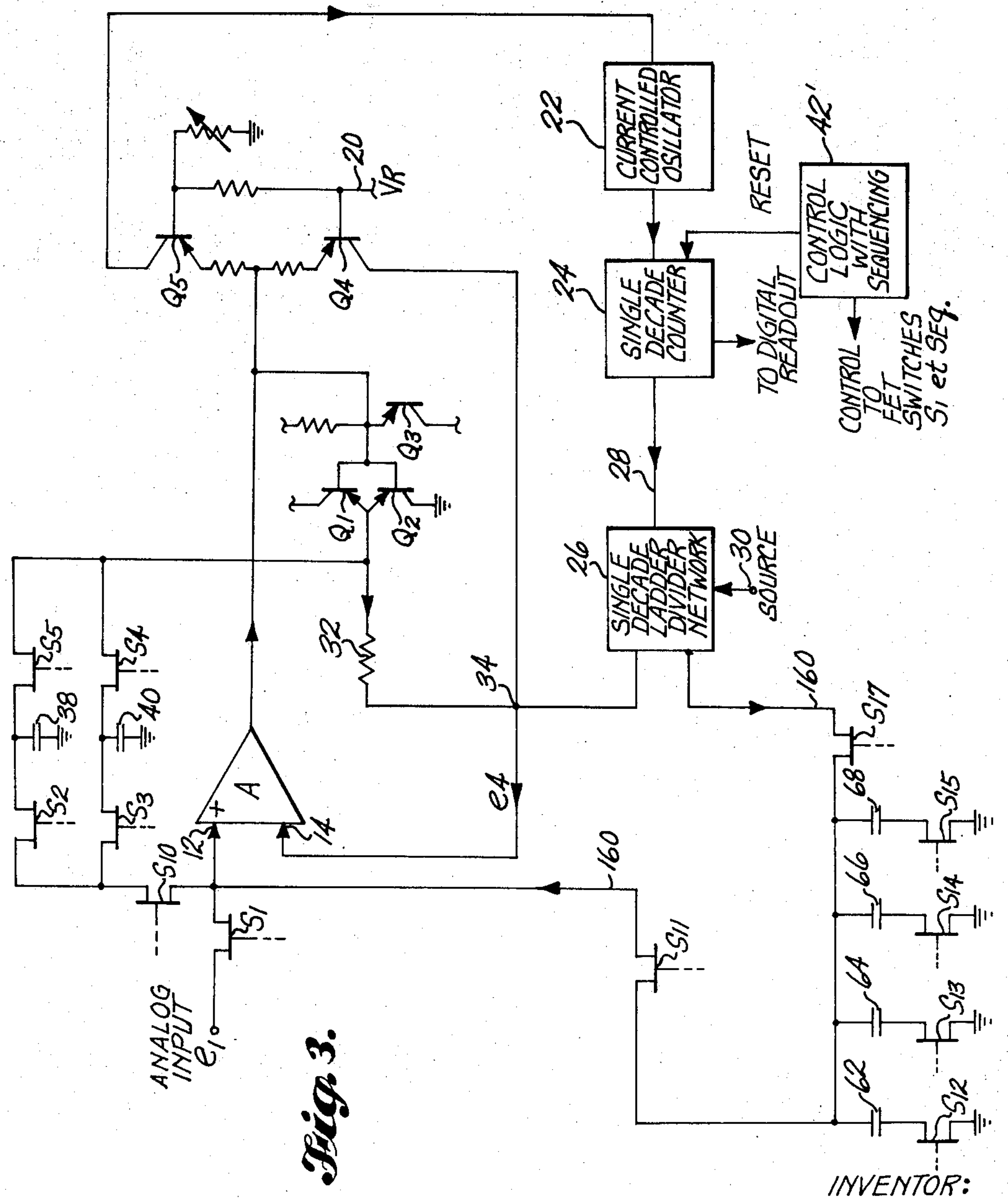
FIG. 3 is a schematic diagram of a modification wherein analog storage of the digits is afforded and a means for maintaining and utilizing the stored analog voltages for an indefinite period of time if desired so as to indicate the original analog input signal value after it has changed or even removed from the input terminal.

In the modification shown in FIG. 3, the basic converter system of FIG. 1 is utilized and is shown in a simplified manner, with corresponding parts bearing reference designations similar to those appearing in the somewhat more detailed previous figure. The purpose of FIG. 3 is to illustrate an arrangement permitting analog storage of the digit place values of the input signal and making possible for the continued retention and display of the stored digit values should the input analog signal be removed from the system or should it be interrupted three to a value.

In order to simplify the illustration, control logic 42' is assumed to incorporate means to sequence the logic circuits, equivalent to the shift register 44 in the previous illustration and the connections from the control logic to the various FET switches are not shown but the control functions and the connection arrangement to the FET switches will be obvious from the description. FET switch $S_{10}$, normally closed, is interposed between amplifier input terminal 12 and the sample and hold circuit comprising condensers 38 and 40. FET switch $S_{11}$, normally open, is interposed in conductor 60 on one side of a bank of digit valve storage condensors 62, 64, 66 and 68 (assuming four digit place readout) and FET switch $S_{18}$ is interposed in such conductor at the opposite side of such bank and leading to a secondary output 62 from the single decade ladder divider network 26. The opposite sides of each of the condensers 62, 64, 66 and 68 are connected through respective normally open FET switches $S_{12}$, $S_{13}$, $S_{14}$, and $S_{15}$ to ground.

Operationally, FET switches $S_1$ and $S_{10}$ remain open when it is desired to hold a reading in the Nixie tube indicator based on stored analog values of the signal for the respective digit places as stored in condensers 62, 64, 66 and 68 for the respective four digit places of the readout. During the first digit period, after the inception of the digitizing phase D, the stored voltage on condenser 62 is applied to the amplifier input 12 by closure of switch $S_{12}$, with $S_{10}$ open and $S_{17}$ open. This runs up the corresponding digital incremental accumulation of voltage in the divider network 26 to a value corresponding to the charge on condenser 62, which represents the first place digit value of the original input signal. Then at the inception of the strobe phase S of the first digit period so as to generate the readout as in FIG. 1, here $S_{11}$ is opened and $S_{17}$ closed, with $S_{12}$ remaining closed. This provides feedback to condenser 62 compensating for any slight loss of charge on condenser 62 during period D in which it drove amplifier $A_1$. This same sequence occurs during the second digit period, now with respect to condenser 64 and FET switch $S_{13}$, representing the second place digit value to be fed back into the system so as to operate the number readout. This sequence is repeated through the remaining digits.

Having just described the manner of continuing to store and provide a reading of the original analog input signal digitally after it is removed or changed, a brief description will now be given of the manner of developing the appropriate charges on the condensers 62, 64, 66 and 68 preparatory to the continuing storage and readout functions. This phase is programmed by the control logic such that during the normal 1st digit period wherein the sample and hold circuit is operative and switch $S_{10}$ is closed, switch $S_{11}$ being then opened, switch $S_{17}$ is closed and remains so as the successive digitizing steps occur in the respective first, second, third, and fourth digit period. During the first digit period when the ladder divider network 26 is generating a voltage corresponding to the first digit place value of the applied input signal $e_1$, FET switch $S_{12}$ is closed so as to accumulate a voltage on condenser 62 corresponding to the accumulated voltage developed by the network 26. At the end of the 1st digit period FET switch $S_{12}$ is opened so that the charge on condenser 62 remains fixed. At the inception of the second digit period FET switch $S_{13}$ is closed so that condenser 64 accumulates a charge corresponding to the voltage developed by the divider network 26 during such second digit period. The sequence continues through the succeeding digit periods with respect to condensers 66 and 68 respectively so that by the end of the conversion sequence of the system in its normal mode of operation (already described in conjunction with FIGS. 1 and 2) the condensers 62, 64, 66, and 68 store analog values of voltage corresponding to the respective digit place values of the applied analog input signal $e_1$.

These and other advantages and aspects of the invention will be seen to reside in the disclosed system, the present disclosure of which is to be considered as illustrative only and not limiting with respect to the inventive concepts hereinafter claimed.

What is claimed is:

1. An analog to digital converter comprising:

a differential amplifier having two inputs and an output;

coupling means connected to said inputs of said differential amplifier for applying an input analog signal having a digit base to one of said inputs of said differential amplifier;

a digital feedback path connected to the output of said differential amplifier and to one of said inputs of said differential amplifier, said digital feedback path being operable over a first digit period to derive from the output of said differential amplifier and apply to one of said inputs of said differential amplifier a first negative feedback signal comprising a variable voltage having any of at least three different values proportional to the first digit value of said input analog signal;

a remainder feedback path connected to the output of said differential amplifier and to one of said inputs of said differential amplifier, said remainder feedback path being operable over said first digit period to apply in additive relation to the first negative feedback signal a second negative feedback signal proportional to the arithmetic difference between said first digit value and said input analog signal to one of said inputs of said differential amplifier;

storage means connected to said remainder feedback path for deriving and storing a recirculatable remainder analog signal proportional to said arithmetic difference between said first digit value and said input analog signal multiplied by the digit base of said analog signal; and, control means connected to said storage means for applying said recirculatable remainder analog signal substitutionally for said input analog signal and causing reoperation of said differential amplifier to derive the second digit value of said input analog signal.

2. An analog to digital converter as claimed in claim 1 wherein one of said two inputs of said differential amplifier is a positive input and the other input is a negative input; and, wherein said coupling means comprises a positive analog terminal connected to the positive input of said differential amplifier and a negative analog input terminal connected to the negative input of said differential amplifier, said positive analog terminal being adapted to receive positive analog signals and said negative analog terminal being adapted to receive negative analog signals.

3. An analog to digital converter as claimed in Claim 2 wherein said digital feedback path comprises:

a current controlled oscillator connected to the output of said differential amplifier so as to receive a signal from said differential amplifier when the output of said differential amplifier is above the digit base of said input analog signal;

a counter connected to the output of said current controlled oscillator to count the pulses generated by said current controlled oscillator; and, a constant resistance, voltage variable network connected to the output of said counter, the output of said constant resistance, voltage variable network being connected to the negative input of said differential amplifier so as to apply a variable voltage having a level proportional to the number of pulses counted by said counter to the negative input of said differential amplifier.

4. An analog to digital converter as claimed in claim 3 wherein said remainder feedback path comprises:

a clamping circuit connected to the output of said differential amplifier for clamping the output of said differential amplifier to a voltage value related to the digit base of said input analog signal; and, a resistor connected between the output of said clamping circuit and the negative input of said differential amplifier.

5. An analog to digital converter as claimed in claim 4 wherein said storage means comprises:

a first storage capacitor;

a first switch connected between the junction between said clamping circuit and said resistor, and said first storage capacitor for charging said first storage capacitor in accordance with the voltage at said junction when said first switch is closed and preventing the charging of said first capacitor when said first switch is open;

a second switch connected between said first storage capacitor and the positive input of said differential amplifier for applying the charge on said first storage capacitor to said positive input when said second switch is closed and preventing the application of any charge from said first storage capacitor to said positive input when said second switch is open;

a second storage capacitor;

a third switch connected between the junction between said clamping circuit and said resistor, and said second storage capacitor for charging said second storage capacitor in accordance with the voltage at said junction when said third switch is closed and preventing the charging of said second storage capacitor when said third switch is open; and, a fourth switch connected between said second storage capacitor and the positive input of said differential amplifier for applying the charge on said second storage capacitor to said positive input when said fourth switch is closed and preventing the application of any charge from said second storage capacitor to said positive input when said fourth switch is open, said first, second, third and fourth switches being controlled by said control means.

6. An analog to digital converter as claimed in claim 5 wherein said control means comprises:

a control logic circuit suitable for generating a plurality of control signals at a plurality of control outputs, said control signals being adapted to control the operation of said analog to digital converter, certain of said plurality of control outputs being connected to said first, second, third and fourth switches so as to open and close said switches in a predetermined sequence; and a recirculatable shift register having a plurality of outputs connected to the inputs of said control logic circuit for causing said control logic circuit to generate said plurality of control signals in a predetermined sequence.

7. An analog to digital converter as claimed in claim 6 including an indicating means for providing a visual indication of the digital representation of the input analog signal, said indicating means comprising:

a Nixie tube indicator formed of a plurality of Nixie tubes;

a binary digital to decade digital driver circuit having its inputs connected to the output of said counter and having its outputs connected to the cathodes of the plurality of Nixie tubes forming said Nixie tube indicator; and, a Nixie tube anode strobe circuit having its inputs connected to the outputs of said recirculatable shift register and its outputs connected to the anodes of the plurality of Nixie tubes forming said Nixie tube indicator.

8. An analog to digital converter as claimed in claim 7 including a drift correction circuit having an input connected to sense the drift in the output of said differential amplifier and having an output connected to an input of said differential amplifier to correct for drift, said drift correction circuit having a control input connected to a control signal output of said control logic circuit so that drift correction is performed in a predetermined time period in the sequence of operation of said analog to digital converter.

9. An analog to digital converter as claimed in claim 8 including:

a fifth switch connected between said positive analog input terminal and the positive input of said differential amplifier; and, a sixth switch connected between said negative analog input terminal and said the negative input of said differential amplifier, said fifth and sixth switchs being connected to said control logic circuit so as to be opened and closed by said control logic circuit.

10. An analog to digital converter as claimed in claim 9 including an initial saturation prevention feedback path connected between the output of said differential amplifier and the negative input of said differential amplifier so as to prevent initial saturation of said differential amplifier.

11. An analog to digital converter as claimed in claim 1 wherein said digital feedback path comprises:

a current controlled oscillator connected to the output of said differential amplifier so as to receive a signal from said differential amplifier when the output of said differential amplifier is above the digit base of said input analog signal;

a counter connected to the output of said current controlled oscillator to count the pulses generated by said current controlled oscillator; and, a constant resistance, voltage variable network connected to the output of said counter, the output of said constant resistance, voltage variable network being connected to said one input of said differential amplifier so as to apply a variable voltage having a level proportional to the number of pulses counted by said counter to said one input of said differential amplifier.

12. An analog to digital converter as claimed in claim 11 wherein said remainder feedback path comprises:

a clamping circuit connected to the output of said differential amplifier for clamping the output of said differential amplifier to a voltage value related to the digit base of said input analog signal; and, a resistor connected between the output of said clamping circuit and said one input of said differential 13. An analog to digital converter as claimed in claim 12 wherein said storage means comprises:

a first storage capacitor;

a first switch connected between the junction between said clamping circuit and said resistor, and said first storage capacitor for charging said first storage capacitor in accordance with the voltage at said junction when said first switch is closed and preventing the charging of said first capacitor when said first switch is open;

a second switch connected between said first storage capacitor and the other input of said differential amplifier for applying the charge on said first storage capacitor to said other input when said second switch is closed and preventing the application of any charge from said first storage capacitor to said other input when said second switch is open;

a second storage capacitor;

a third switch connected between the junction between said clamping circuit and said resistor, and said second storage capacitor for charging said second storage capacitor in accordance with the voltage of said junction when said third switch is closed and preventing the charging of said second storage capacitor when said third switch is open; and, a fourth switch connected between said second storage capacitor and said other input of said differential amplifier for applying the charge on said second storage capacitor to said other input when said fourth switch is closed and preventing the application of any charge from said second storage capacitor to said other input when said fourth switch is open, said first, second, third and fourth switches being controlled by said control means.

14. An analog to digital converter as claimed in claim 13 including an initial saturation prevention feedback path connected between the output of said differential amplifier and said one input of said differential amplifier so as to prevent initial saturation of said differential amplifier.

15. An analog to digital converter as claimed in claim 1 wherein said remainder feedback path comprises;

a clamping circuit connected to the output of said differential amplifier for clamping the output of said differential amplifier to a voltage value related to the digit base of said input analog signal; and, a resistor connected between the output of said clamping circuit and said one input of said differential amplifier.

16. An analog to digital converter as claimed in claim 15 incluiding an initial saturation prevention feedback path connected between the output of said differential amplifier and said one input of said differential amplifier so as to prevent initial saturation of said differential amplifier.

17. An analog to digital converter as claimed in claim 1 including an initial saturation prevention feedback path connected between the output of said differential amplifier and said one input of said differential amplifier so as to prevent initial saturation of said differential amplifier.

* * * * *